(12) United States Patent
Xiao

(10) Patent No.: US 9,748,405 B2
(45) Date of Patent: Aug. 29, 2017

(54) TRANSISTOR AND FABRICATION METHOD THEREOF

(71) Applicant: Semiconductor Manufacturing International (Shanghai) Corporation, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/073,772

(22) Filed: Mar. 18, 2016

(65) Prior Publication Data
US 2016/0293772 A1    Oct. 6, 2016

(30) Foreign Application Priority Data

Mar. 31, 2015  (CN) .......................... 2015 1 0149074

(51) Int. Cl.
| | |
|---|---|
| *H01L 27/12* | (2006.01) |
| *H01L 29/786* | (2006.01) |
| *H01L 29/06* | (2006.01) |
| *H01L 29/423* | (2006.01) |
| *H01L 29/66* | (2006.01) |

(52) U.S. Cl.
CPC .... *H01L 29/78696* (2013.01); *H01L 29/0673* (2013.01); *H01L 29/42392* (2013.01); *H01L 29/66742* (2013.01); *H01L 29/78681* (2013.01)

(58) Field of Classification Search
CPC ...................... H01L 29/78696; H01L 29/0673
See application file for complete search history.

(56) References Cited

U.S. PATENT DOCUMENTS

| | | | | |
|---|---|---|---|---|
| 9,368,574 | B1* | 6/2016 | Basu | H01L 21/0259 |
| 2011/0012090 | A1* | 1/2011 | Singh | B82Y 10/00 |
| | | | | 257/24 |
| 2014/0166903 | A1* | 6/2014 | Fujita | G01N 21/6486 |
| | | | | 250/458.1 |
| 2015/0263094 | A1* | 9/2015 | Diaz | H01L 29/7842 |
| | | | | 257/24 |
| 2016/0149249 | A1* | 5/2016 | Pozvonkov | C25B 9/08 |
| | | | | 429/490 |

* cited by examiner

*Primary Examiner* — Marc Armand
*Assistant Examiner* — Sarah Salerno
(74) *Attorney, Agent, or Firm* — Anova Law Group, PLLC

(57) ABSTRACT

A method for fabricating a transistor is provided. The method includes providing a semiconductor substrate; and forming at least a nanowire suspending in the semiconductor substrate. The method also includes forming a channel layer surrounding the nanowire; and forming a contact layer surrounding the channel layer. Further, the method includes forming a trench exposing the channel layer and surrounding the channel layer in the contact layer; and forming a potential barrier layer on the bottom of the trench and surrounding the channel layer. Further, the method also includes forming a gate structure surrounding the potential barrier layer and covering portions of the contact layer; and forming a source and a drain region on the contact layer at two sides of the gate structure, respectively.

13 Claims, 8 Drawing Sheets

TRANSISTOR AND FABRICATION METHOD THEREOF

CROSS-REFERENCES TO RELATED APPLICATIONS

This application claims the priority of Chinese patent application No. 201510149074.6, filed on Mar. 31, 2015, the entirety of which is incorporated herein by reference.

FIELD OF THE INVENTION

The present invention generally relates to the field of semiconductor technology and, more particularly, relates to transistors and fabrication processes thereof.

BACKGROUND

With the rapid development of semiconductor manufacturing technology, semiconductor devices have been developed toward high device density. As basic semiconductor devices, transistors have been widely used. With the continuous increase of the device density, the critical dimension of the gate structures of transistors has become smaller and smaller. However, reducing the critical dimension of the gate structures often causes the transistors to have a short channel effect. Thus, leakage current is generated; and the performance of the semiconductor device is affected.

A transistor usually includes a semiconductor substrate; a gate dielectric layer formed on the surface of the semiconductor substrate; a gate electrode layer formed on the gate dielectric layer; sidewall spacers formed on the semiconductor substrate and covering the side surfaces of the gate dielectric layer and the gate electrode layer; and source and drain regions formed in the semiconductor substrate at both sides of the sidewall spacers.

When the technical node is further reduced, the short channel effect of the transistor has become more intense; and the control ability of the gate structure to the channel region has become weaker and weaker. The disclosed device structures and methods are directed to solve one or more problems set forth above and other problems.

BRIEF SUMMARY OF THE DISCLOSURE

One aspect of the present disclosure includes providing a method for fabricating a transistor. The method includes providing a semiconductor substrate; and forming at least a nanowire suspending in the semiconductor substrate. The method also includes forming a channel layer surrounding the nanowire; and forming a contact layer surrounding the channel layer. Further, the method includes forming a trench exposing the channel layer and surrounding the channel layer in the contact layer; and forming a potential barrier layer on the bottom of the trench and surrounding the channel layer. Further, the method also includes forming a gate structure surrounding the potential barrier layer and covering portions of the contact layer; and forming a source region and a drain region on the contact layer at two sides of the gate structure, respectively.

Another aspect of the present disclosure includes providing a transistor. The transistor includes a semiconductor substrate; and at least a nanowire suspending in the semiconductor substrate. The transistor also includes a channel layer surrounding the nanowire; and a contact layer surrounding the channel layer. Further, the transistor includes a potential barrier layer surrounding a portion of the channel layer; and a gate structure surrounding the potential barrier layer formed in the contact layer; and a source region and a drain region surrounding the contact layer at two sides of the gate structure formed in the contact layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 19:
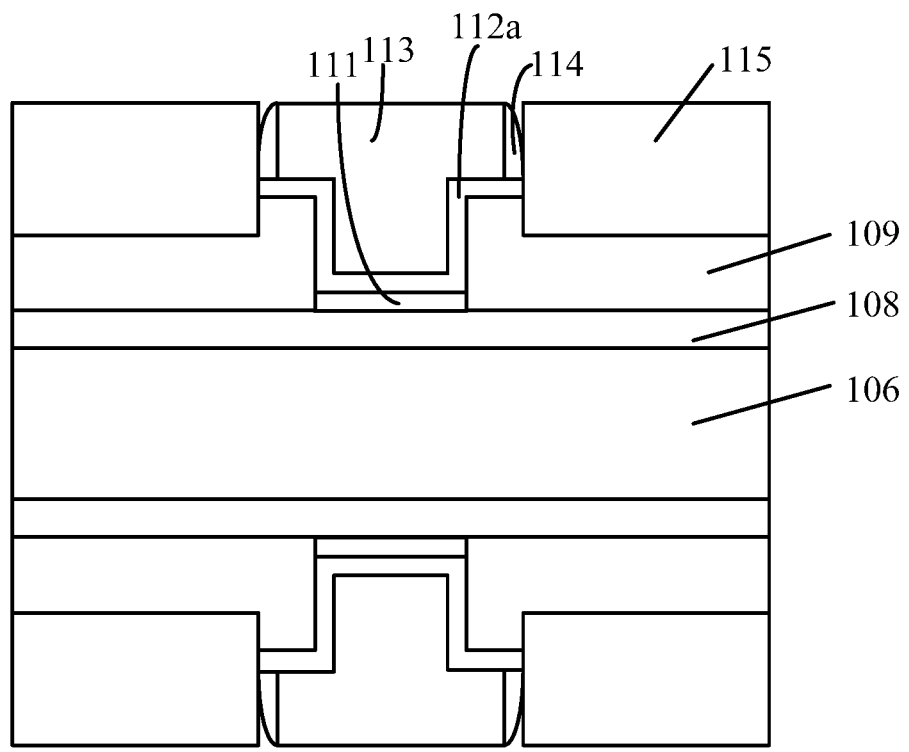
Figure 20:
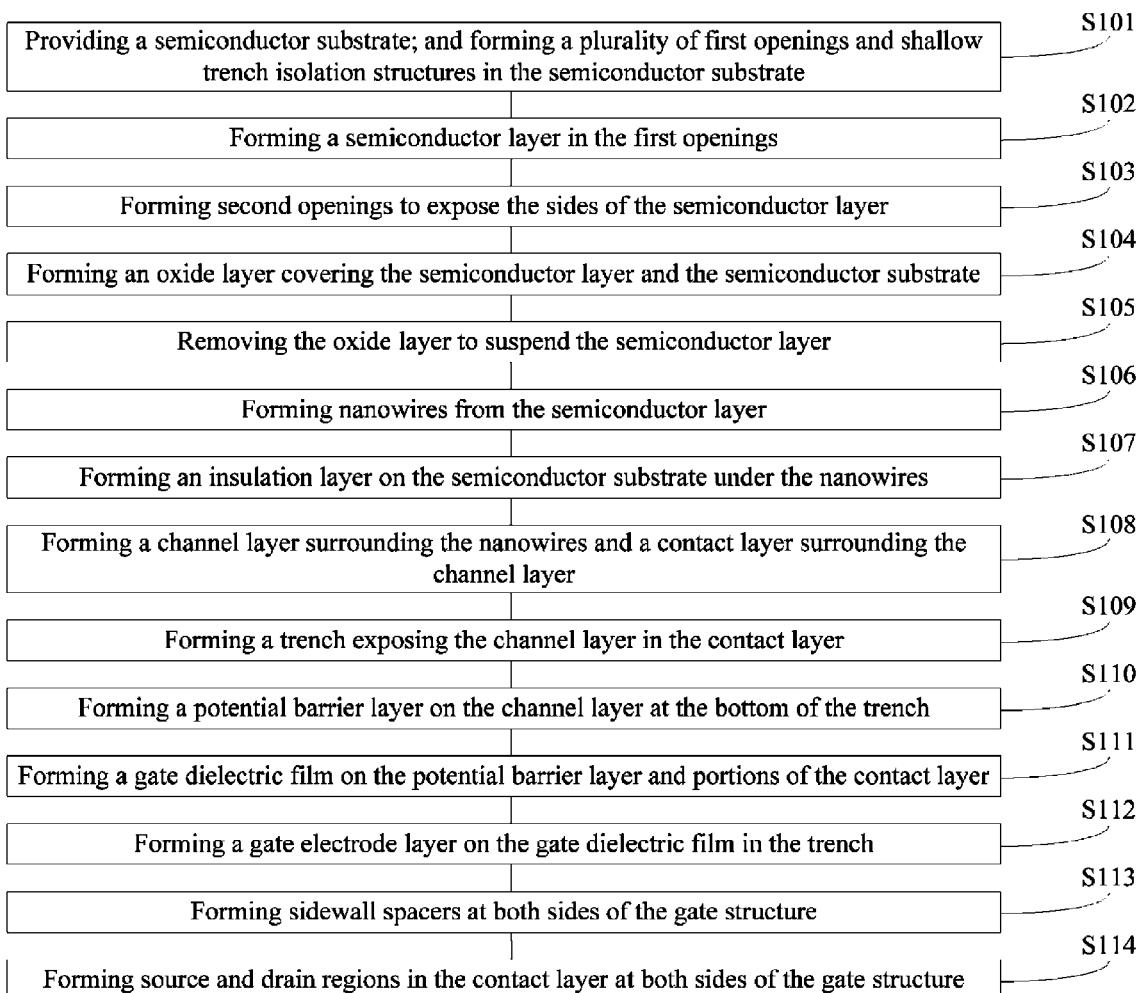
FIG. 20 illustrates an exemplary fabrication process of a transistor consistent with the disclosed embodiments.

FIG. 20 illustrates an exemplary fabrication process of a transistor consistent with the disclosed embodiments; and FIGS. 1~19 illustrate semiconductor structures corresponding to certain stages of the exemplary fabrication process.

Figure 1:
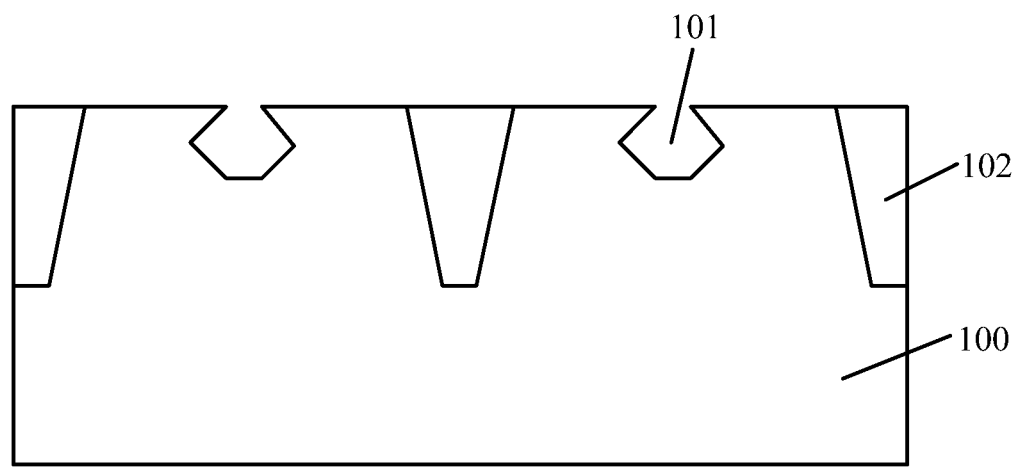
FIGS. 1~19 illustrate semiconductor structures corresponding to certain stages of an exemplary fabrication process of a transistor consistent with the disclosed embodiments.

As shown in FIG. 20, at the beginning of fabrication process, a semiconductor substrate with certain structures is provided (S101). FIG. 1 illustrates a corresponding semiconductor structure.

As shown in FIG. 1, a semiconductor substrate 100 is provided. A plurality of first openings 101 may be formed in the semiconductor substrate 100. Further, a plurality of shallow trench isolation (STI) structures 102 may be formed in the semiconductor substrate 100. The shallow trench isolation structures 102 may be used to insulate adjacent structures.

The semiconductor substrate 100 may be made of any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor, or a combination thereof. The semiconductor substrate 100 may also be a glass substrate. The semiconductor substrate 100 provides a base for subsequent devices and processes.

The first openings 101 may provide a base for subsequently forming nanowires. To cause the cross-section of the subsequently formed nanowires to be more close to a circle, the first openings 101 may have a regular polygon shape, such as a square, or a regular hexagon ("Sigma" shape), etc. In certain other embodiments, the first openings 101 may have a bowel shape. In one embodiment, the semiconductor substrate 100 is made of silicon; and the first openings 101 have a sigma shape.

The first openings 101 may be formed by any appropriate process, such as a dry etching process, a wet etching process, or a combination of a dry etching process and a wet etching process, etc. The shallow trench isolation structures 102 may be formed by forming shallow trenches in the semiconductor substrate 100; and followed by filling an insulation material in the shallow trenches.

Figure 2:
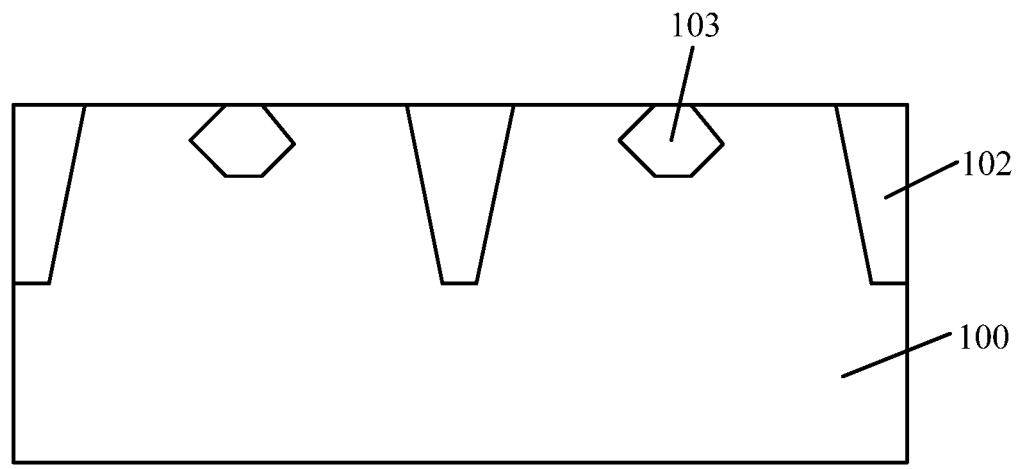

Returning to FIG. 20, after providing the semiconductor substrate 100 and forming the first openings 101, a semiconductor layer may be formed (S102). FIG. 2 illustrates a corresponding semiconductor structure.

As shown in the FIG. 2, a semiconductor layer 103 is formed in the first openings 101. The semiconductor layer 103 may be subsequently oxidized to form nanowires.

The semiconductor layer 103 may be made of any appropriate material, such as silicon, silicon germanium, germanium, or silicon carbide, etc. To prevent the subsequent etching process from damaging the semiconductor substrate 100 and affecting the morphology of the subsequently formed nanowires, the semiconductor layer 103 and the semiconductor substrate 100 may be made of different materials; and may have a relatively large etching selectivity.

The semiconductor layer 103 may be formed by any appropriate process, such as a chemical vapor deposition (CVD) process, a physical vapor deposition (PVD) process, an atomic layer deposition (ALD) process, an epitaxial deposition process, or a flowable CVD (FCVD) process, etc. In one embodiment, the semiconductor layer 103 is made of silicon germanium, an epitaxial deposition process is used to form the semiconductor layer 103.

Figure 3:
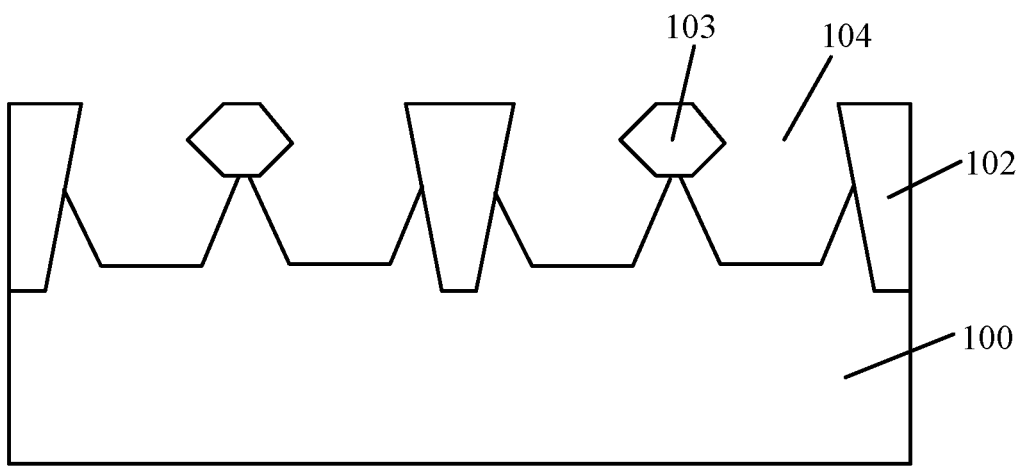

Returning to FIG. 20, after forming the semiconductor layer 103, second openings may be formed (S103). FIG. 3 illustrates a corresponding semiconductor structure.

As shown in FIG. 3, a plurality of second openings 104 are formed. The second openings 104 may connect with the first openings 101 (referring to FIG. 1); and expose the sides of the semiconductor layer 103 in the first openings 101. In one embodiment, the second openings 104 may also expose portions of the side surfaces of the shallow trench isolation structures 102.

The second openings 104 may be formed by any appropriate process, such as a dry etching process, or a wet etching process, etc. In one embodiment, the semiconductor layer 103 may be formed in the first openings 101, and the portion of the semiconductor layer 103 in each of the first openings 101 may have a sigma-shaped cross-section. Thus, to prevent the semiconductor layer 103 from being damaged by the etching process, a selective etching process may be used to form the second openings 104. The damages to the semiconductor layer 103 may affect the quality of the subsequently formed nanowires.

In certain other embodiments, if the cross-section of the portions of the semiconductor layer 103 in the first openings 101 is a square, a normal etching process may be used to form the second openings 104. Specifically, a patterned photoresist layer may be formed on the semiconductor substrate 100. The patterned photoresist layer may define the position and the shape of the second openings 104. Then, the semiconductor substrate 100 may be etched using the patterned photoresist layer as an etching mask to form the second openings 104. After forming the second openings 104, the patterned photoresist layer may be removed.

Figure 4:
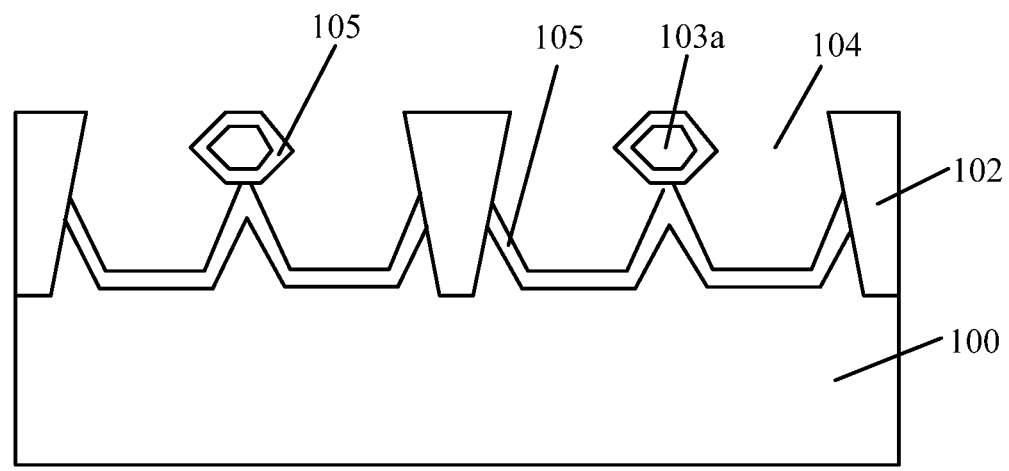

Returning to FIG. 20, after forming the second openings 104, an oxide layer may be formed (S104). FIG. 4 illustrates a corresponding semiconductor structure.

As shown in FIG. 4, an oxide layer 105 is formed. The oxide layer 105 may cover the remaining semiconductor layer 103a and the remaining semiconductor substrate 100.

The oxide layer 105 may cause silicon in the semiconductor layer 103 to react with oxygen to reduce the content of silicon in the remaining semiconductor layer 103a. It may facilitate the atoms in the remaining semiconductor layer 103a to rearrange to form nanowires during a subsequent process.

The oxide layer 105 may be formed by any appropriate process, such as a thermal oxidation process, or a wet oxidation process, etc. In one embodiment, the oxide layer 105 is formed by a thermal oxidation process. The temperature of the thermal oxidation process may be in a range of approximately 800° C.~1200° C. The flow rate of oxygen may be in a range of approximately 0.5 l/min~5.0 l/min. The time duration of the thermal oxidation process may be in a range of approximately 30 min~300 min.

Further, the subsequently formed nanowires may be suspended after removing the oxide layer 105. Thus, it may require the oxide layer 105 to have a certain thickness such that the nanowires are suspended after removing the oxide layer 105. In one embodiment, the thickness of the oxide layer 105 may be in a range of approximately 2.0 nm~20.0 nm.

Figure 5:
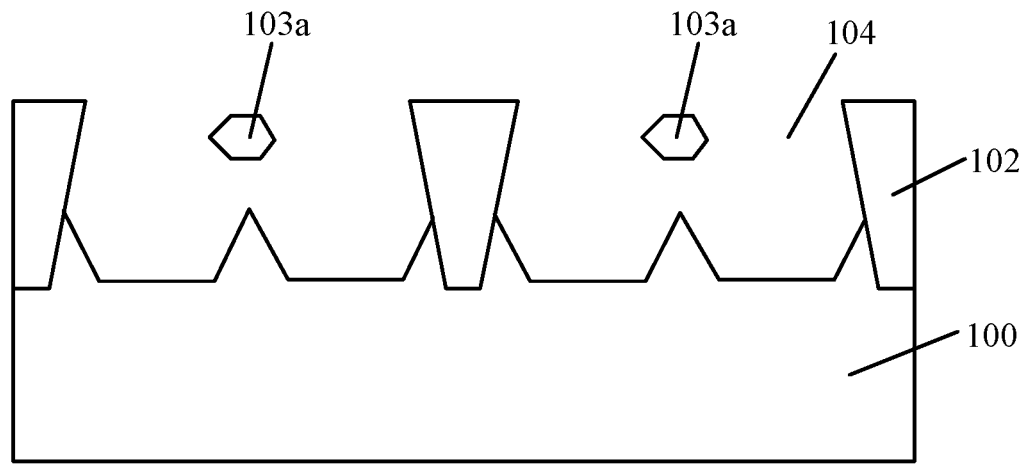

Returning to FIG. 20, after forming the oxide layer 105, the oxide layer 105 may be removed (S105). FIG. 5 illustrates a corresponding semiconductor structure.

As shown in FIG. 5, the oxide layer 105 is removed; and the remaining semiconductor layer 103a may be suspended in the semiconductor substrate 100. The oxide layer 105 may be removed by any appropriate process, such as a dry etching process, or a wet etching process, etc. To subsequently form suspending nanowires, a wet etching process is used to remove the oxide layer 105.

Specifically, the oxide layer 105 may be removed by a diluted hydrogen fluoride acid (DHF). The volume ratio of the hydrogen fluoride acid and water in the DHF may be in a range of approximately 1:10~1:5. The wet etching process may be performed under the room temperature, i.e., in a range of approximately 20° C.~30° C.

In certain other embodiments, the thermal oxidation process and the process for removing the oxide layer 105 may be repeated 2 times~5 times to remove silicon in the remaining semiconductor layer 103a as much as possible. Removing silicon as much as possible may facilitate the subsequent formation of rounded nanowires.

During the practical fabrication process, the two ends of the remaining semiconductor layer 103a may be supported by the portions of the semiconductor layer 103 not being used to form second openings 104 (not shown). Thus, the remaining semiconductor layer 103a may be suspended in the semiconductor substrate 100.

Figure 6:
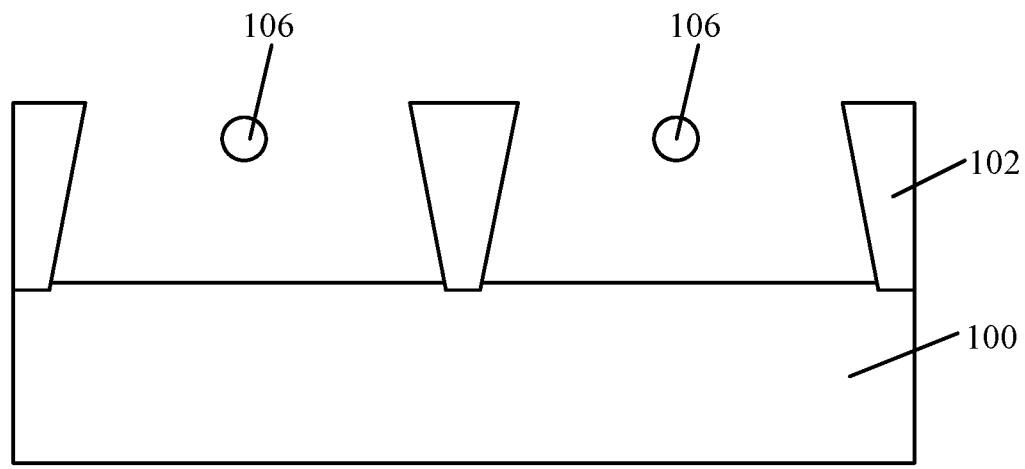

Returning to FIG. 20, after removing the oxide layer 105, nanowires may be formed (S106). FIG. 6 illustrates a corresponding semiconductor structure.

As shown in FIG. 6, nanowires 106 are formed in third openings (not labeled). The nanowires 106 may be formed by performing a thermal annealing process to the remaining semiconductor layer 103a. The thermal annealing process may cause the atoms of the remaining semiconductor layer 103a to rearrange. Thus, the nanowires 106 with further rounded and smooth surfaces may be formed. The cross-section of a nanowire 106 may be a circle. Each portion of the remaining semiconductor layer 103a corresponding to the first openings 101 (refer to FIG. 2) may form one nanowire 106.

The protection gas of the thermal annealing process may be $H_2$, or He, etc. The temperature of the thermal annealing process may be in a range of approximately 650° C.~1200° C. The pressure of the thermal annealing process may be in a range of approximately 0.665 Pa~1.01e15 Pa. The thermal annealing process may be a single-step thermal annealing process, or a multiple-step thermal annealing process.

Further, as shown in the FIG. 6, after the thermal annealing process, the semiconductor substrate 100 may prone to be smooth. Further, the second openings 104 (referring to FIG. 5) at both sides of the remaining semiconductor layer 103a may merge into the third opening (not labeled).

In one embodiment, the semiconductor layer 103 (referring to FIG. 3) is made of silicon germanium. The oxidation process may entirely consume silicon of silicon germanium. Thus, the nanowires 106 may be made of germanium.

Figure 7:
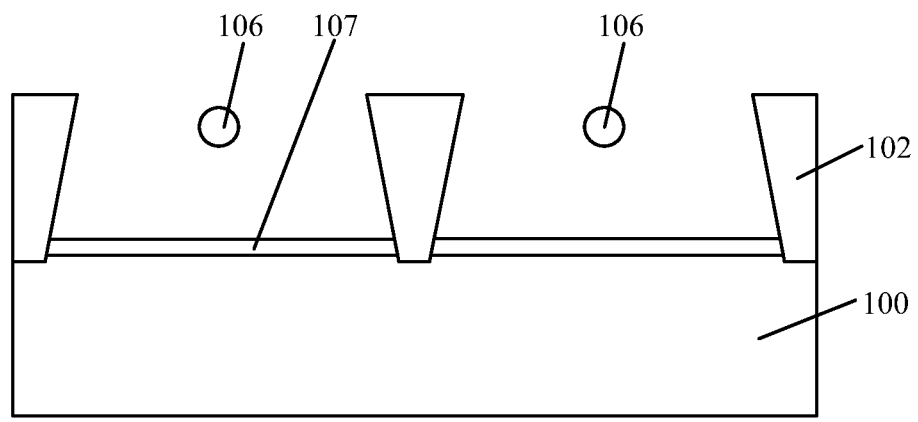

Returning to FIG. 20, after forming the nanowires 106, an insulation layer may be formed (S107). FIG. 7 illustrates a corresponding semiconductor structure.

As shown in FIG. 7, an insulation layer 107 is formed on the semiconductor substrate 100 on the bottom of the third opening. The insulation layer 107 may be used to insulate the subsequently formed nanowire structures (including the subsequently formed gate structure, source and drain, etc.) and the semiconductor substrate 100. To achieve a desired insulation effect, the thickness of the insulation layer 107 may be in a range of approximately 2 nm~100 nm.

The insulation layer 107 may be made of any appropriate material, such as silicon oxide, silicon oxynitride, or silicon carbide, etc. Various processes may be used to form the insulation layer 107, such as a CVD process, an ALD process, or an oxidation process, etc. In one embodiment, the insulation layer 107 is formed by an oxidation process. Specifically, a thermal oxidation process is used to form the insulation layer 107. The temperature of the thermal oxidation process may be in a range of approximately 1000° C.~1200° C. The flow rate of oxygen of the thermal annealing process may be in a range of approximately 0.5 l/min~5.0 l/min. The time duration of the thermal annealing process may be in a range of approximately 30 min~300 min.

During the process for forming the nanowires 106, the thermal oxidation process and the process for removing the oxide layer may be repeated for a plurality of times. Thus, silicon on the surface of the semiconductor layer 103 may be entirely consumed. Thus, it may be difficult to oxidize the nanowires 106. Accordingly, the insolation layer 107 may only be formed on the surface of the semiconductor substrate 100 by the thermal oxidation process.

Figure 8:
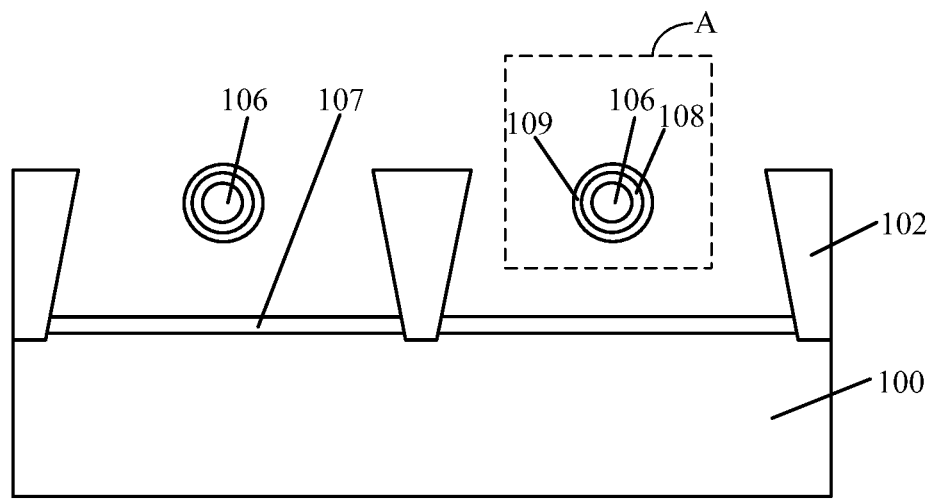
Figure 9:
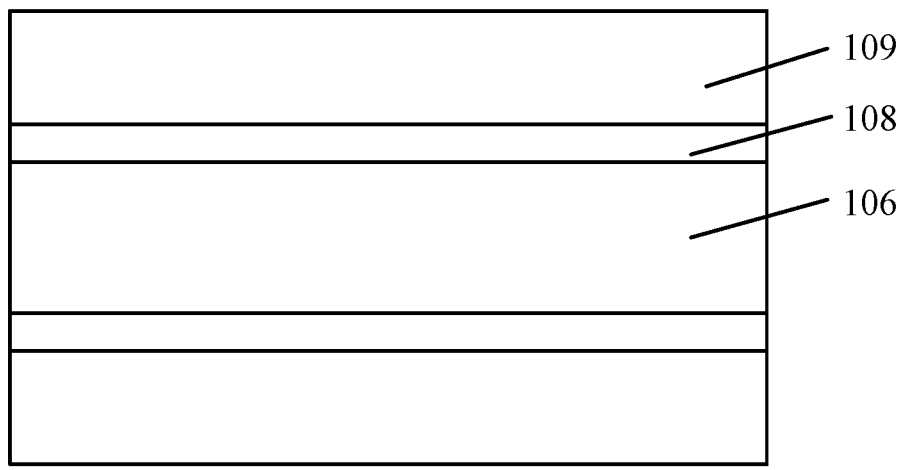

Returning to FIG. 20, after forming the insulation layer 107, a channel layer and a contact layer may be formed (S108). FIG. 8 illustrates a corresponding semiconductor structure. FIG. 9 illustrates a cross-sectional view of the structure in the dashed frame along a longitudinal direction of the nanowire 106. For illustrative purposes, one nanowire 106 will be further described.

As shown in FIGS. 8~9, a channel layer 108 is formed on the surface of the nanowires 106; and a contact layer 109 is formed on the surface of the channel region layer 108. The channel layer 108 may cover the surfaces of the nanowires 106; and the contact layer 109 may cover the surface of the channel layer 108. That is, the channel layer 108 may surround the nanowires 106; and the contact layer 109 may surround the channel layer 108. Thus, the cross-section of the channel layer 108 and the cross-section of the contact layer on a nanowire 106 may be circles concentric with the cross-section of the nanowire 106.

The channel layer 108 may be used to subsequently form channel regions of transistors. The transistors having such channel regions may have relatively high electron mobility. The contact layer 109 may be used to subsequently form source regions and drain regions of the transistors.

The channel layer 108 may be made of any appropriate material, such as InGaAs, InAs, GaSb, InSb, or GaAs, etc. In one embodiment, the channel layer 108 is made of InGaAs. The thickness of the channel layer 108 may be in a range of approximately 10 nm~100 nm. The channel layer 108 may be N-type doped with a doping concentration in a range of approximately 1.0e15 atom/cm$^3$~5.0e17 atom/cm$^3$. Various processes may be used to form the channel layer 108, such as a molecular beam epitaxial (MBE) process, an ALD process, or a metal-organic CVD (MOCVD) process, etc.

The contact layer 109 may be made of any appropriate material, such as InGaAs, InAs, GaSb, InSb, or GaAs, etc. In one embodiment, the contact layer 109 is made of InGaAs. The thickness of the contact layer 109 may be in a range of approximately 10 nm~200 nm. The contact layer 109 may be N-type doped with a doping concentration in a range of approximately 1.0e19 atom/cm$^3$~5.0e19 atom/cm$^3$. Various processes may be used to form the contact layer 109, such as an MBE process, an ALD process, or an MOCVD process, etc.

Figure 10:
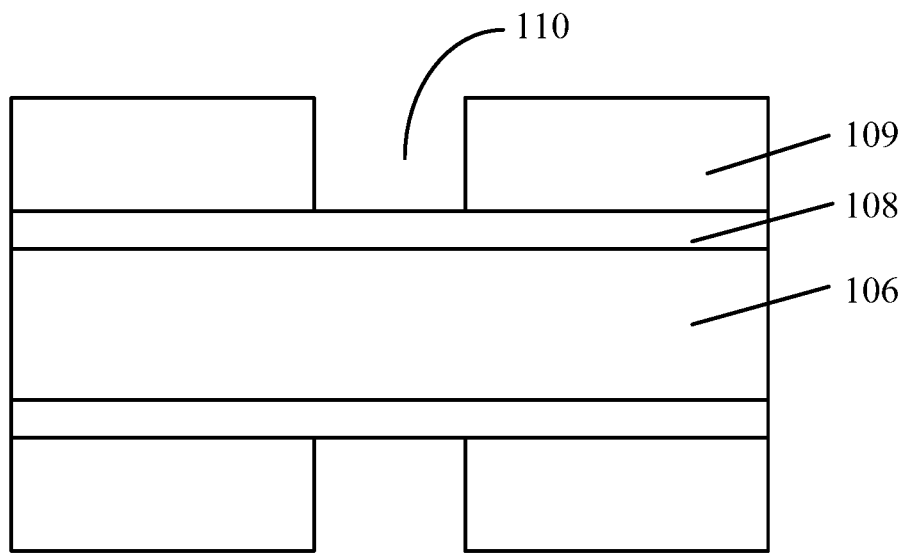
Figure 11:
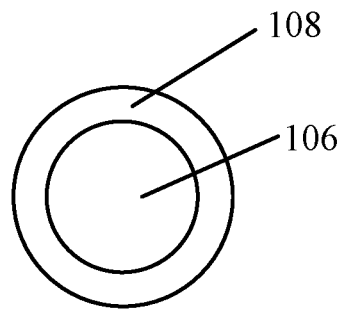

Returning to FIG. 20, after forming the channel layer 108 and the contact layer 109, a trench may be formed (S109). FIG. 10 illustrates a corresponding semiconductor based on the semiconductor structure illustrated in FIG. 9. FIG. 11 illustrates a cross-sectional view of the structure illustrated in FIG. 10 at the trench. The structure illustrated in FIGS. 10~11 is based on one nanowire 106.

As shown in FIGS. 10~11, a trench 110 is formed in the contact layer 109; and the trench 110 may expose the channel layer 108. In one embodiment, the trench 110 may surround the nanowire 106. The trench 110 may separate the contact layer 109; and the separated contact layer 109 may be used to subsequently form a source region and a drain region. Further, the trench 110 may expose a portion of the channel layer 108. A potential barrier layer may be subsequently formed on the exposed portion of the channel layer 108 to form a heterojunction.

A process for forming the trench 110 may include forming a patterned photoresist layer to cover the contact layer 109; and followed by etching the contact layer 109 using the patterned photoresist layer as an etching mask until the channel layer 108 is exposed. The patterned photoresist layer may define the position and the size of the trench 110. After forming the trench 110, the patterned photoresist layer may be removed.

The contact layer 109 may be etched by any appropriate process, such as a dry etching process, or a wet etching process, etc. In one embodiment, a dry etching process is used to etch the contact layer 109 to form the trenches 110. The patterned photoresist layer may be removed by any appropriate process, such as a dry etching process, a wet etching process, or a plasma ashing process, etc.

Figure 12:
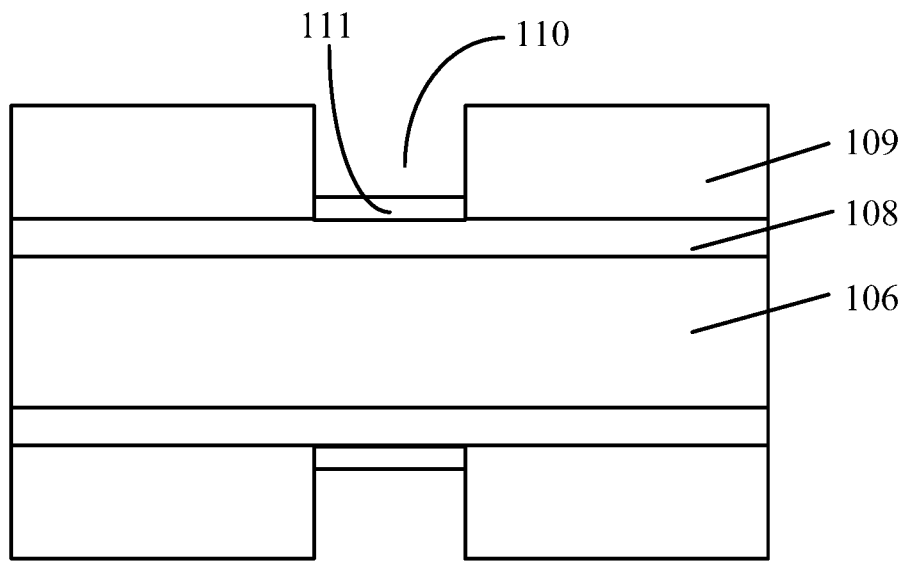
Figure 13:
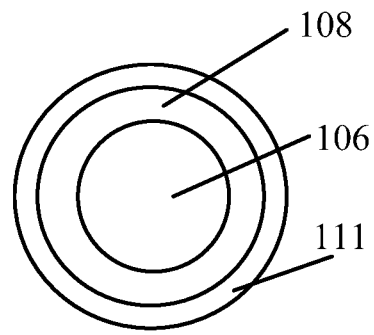

Returning to FIG. 20, after forming the trench 110, a potential barrier layer may be formed (S110). FIG. 12 illustrates a corresponding semiconductor structure. FIG. 13 illustrates a cross-sectional view of the structure illustrated in FIG. 12 at the trench 110.

As shown in FIGS. 12~13, a potential barrier layer 111 is formed on the channel layer 108 on the bottom of the trench 110. The potential barrier layer 111 may cover the portion of the surface of the channel layer 108 exposed by the trench 110. That is, the potential barrier layer 111 may surround the nanowire 106. The potential barrier layer 111 may be used to form a heterojunction with the channel layer 108 and the nanowires 106 (quantum well layer).

The potential barrier layer 111 may be made of any appropriate material, such as InP, or InAlAs, etc. The thickness of the potential barrier layer 111 may be in a range of approximately 1 nm~100 nm. Various processes may be used to form the potential barrier layer 111, such as an MBE process, an ALD process, or an MOCVD process, etc.

When an MBE process is used to form the potential barrier layer 111, the substrate temperature may be relatively low; the growth rate may be relatively low; the intensity of the molecular beam may be relatively easy to control; the composition of the potential barrier layer 111 may be uniform; and the doping concentration may be easily controlled by changing the source material. Thus, the quality of the potential barrier layer 111 may be as desired. Further, when a multiple-layer potential barrier layer is formed by the MBE process, sharp interfaces may be obtained. An in-situ monitoring technique may be used to precisely investigate the growth of the potential barrier layer 111.

The MOCVD process may be able to form any compound semiconductor material and alloy semiconductor material. When the MOCVD process is used to form the potential barrier layer 111, the composition of the potential barrier layer 111 may be precisely controlled; the potential barrier layer 111 may be uniform; and the repeatability of the electrical performance of the potential barrier layer 111 may be as desired. Further, the MOCVD system may be relatively simple; the substrate temperature may have a relatively large range; and it may be able to achieve a mass production.

The ALD process may not be very sensitive to the substrate temperature and the flow rates of the reactants. Thus, it may fully utilize surface saturation reaction. The thickness of the layer formed by the ALD process may be easily controlled. Further, the layer formed by the ALD process may have relatively high stability, relatively high density, relatively flat and relatively high shape retention ability. Thus, when the ALD process is used to form the potential barrier layer 111, comparing with other processes, it may have the advantages for layer uniformity, shape retention, step coverage and thickness control, etc.

In one embodiment, the potential barrier layer 111 is formed by the MOCVD process. The temperature of the MOCVD process may be in a range of approximately 500° C.~800° C. The pressure of the reaction chamber may be in a range of approximately 10 Torr~100 Torr. The reaction gases of the MOCVD process may include trimethylamine (TMIn), $PH_3$, and $SiH_4$, etc. The flow rate of TMIn may be in a range of approximately 0.5 g/min. The flow rate of $PH_3$ may be in a range of approximately 0.5 l/min~5.0 l/min. The flow rate of $SiH_4$ may be in a range of approximately $1.0e16$ $atom/cm^3$~$8.0e17$ $atom/cm^3$. The product of such reaction gases may include InP. That is, the potential barrier layer 111 may be made of InP. The potential barrier layer 111 may be N-type doped.

Figure 14:
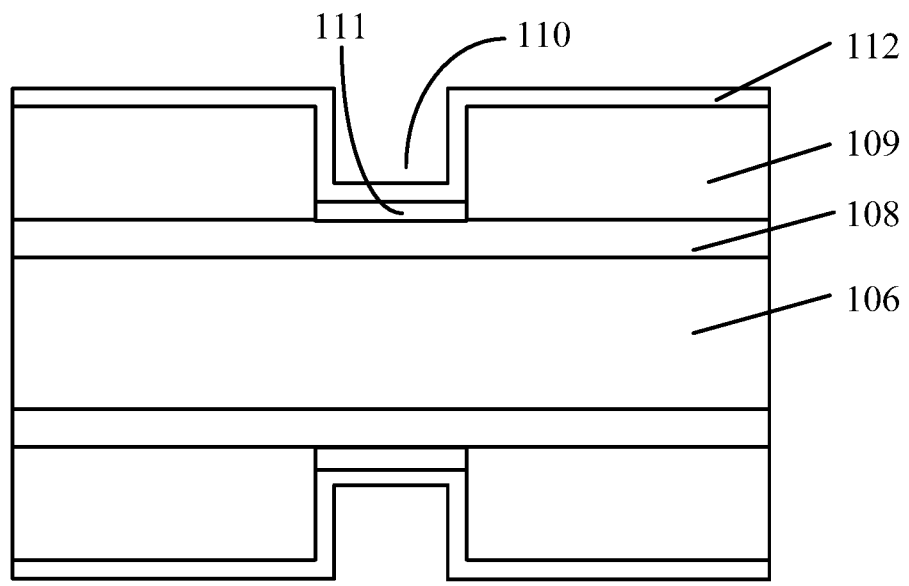
Figure 15:
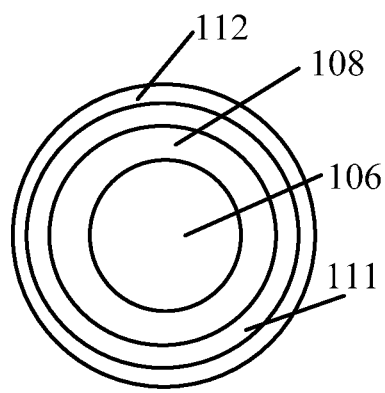

Returning to FIG. 20, after forming the potential barrier layer 111, a gate dielectric film may be formed (S111). FIG. 14 illustrates a corresponding semiconductor structure. FIG. 15 illustrates a cross-sectional view of the structure illustrated in FIG. 14 at the trench 110.

As shown in FIGS. 14~15, a gate dielectric film 112 is formed. The gate dielectric film 112 may cover the potential barrier layer 111 and the contact layer 109. The gate dielectric film 112 may be used to subsequently form a gate dielectric layer.

The gate dielectric film 112 may be made of any appropriate material, such as silicon oxide, silicon nitride, or high dielectric constant (high-K) material including $Al_2O_3$, and $TiSiO_x$, etc. The thickness of the gate dielectric film 112 may be in a range of approximately 1 nm~5 nm. Such a thickness range may ensure a desired insolation effect. In one embodiment, the gate dielectric film 112 is made of $TiSiO_x$. The thickness of the gate dielectric film 112 is approximately 4 nm. Various processes may be used to form the gate dielectric film 112, such as a MBE process, an ALD process, or a MOCVD process, etc.

Figure 16:
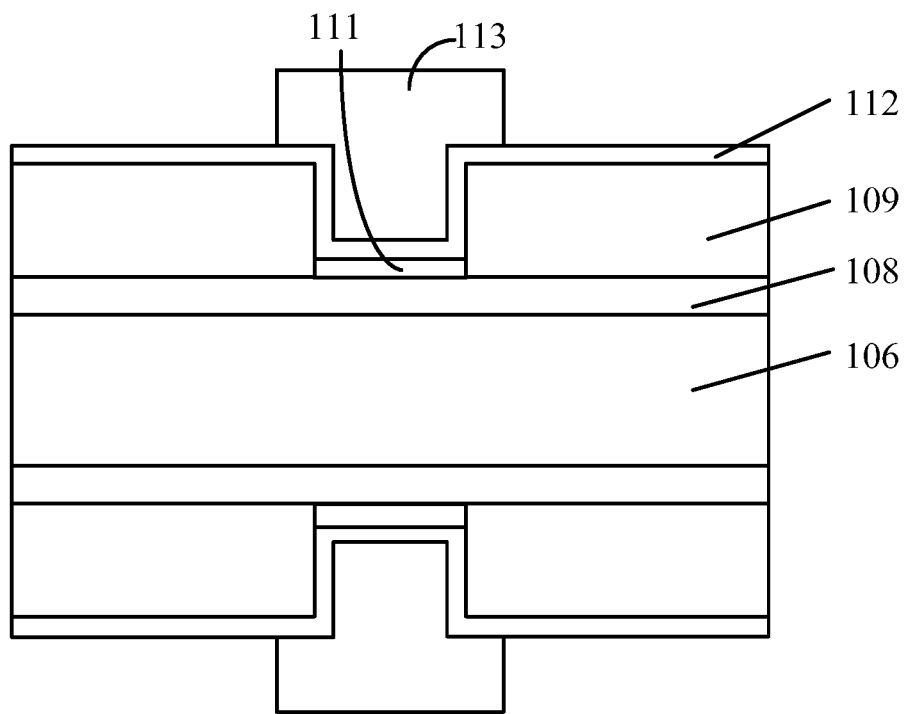
Figure 17:
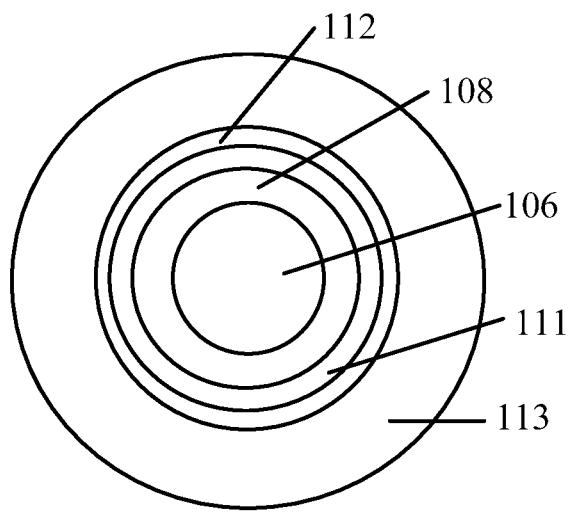

Returning to FIG. 20, after forming the gate dielectric film 112, a gate electrode layer may be formed (S112). FIG. 16 illustrates a corresponding semiconductor structure. FIG. 17 illustrates a cross-sectional view of the structure illustrated in FIG. 16 at the middle of the potential barrier layer 111.

As shown in FIGS. 16~17, a gate electrode layer 113 is formed on the gate dielectric film 112. The gate electrode layer 113 may fill the trench 110; and may be higher than the top of the trench 110. The gate electrode layer 113 may be used to form the gate structure of a transistor. The transistor may have relatively high electron mobility.

The gate electrode layer 113 may be made of any appropriate material, such as poly silicon, TiN, NiAu, or CrAu, etc. Various processes may be used to form the gate electrode layer 113, such as a PVD process, a MBE process, an ALD process, or a MOCVD process, etc. In one embodiment, the gate electrode layer 113 is made of TiN; and the gate electrode layer 113 is formed by a MOCVD process.

Figure 18:
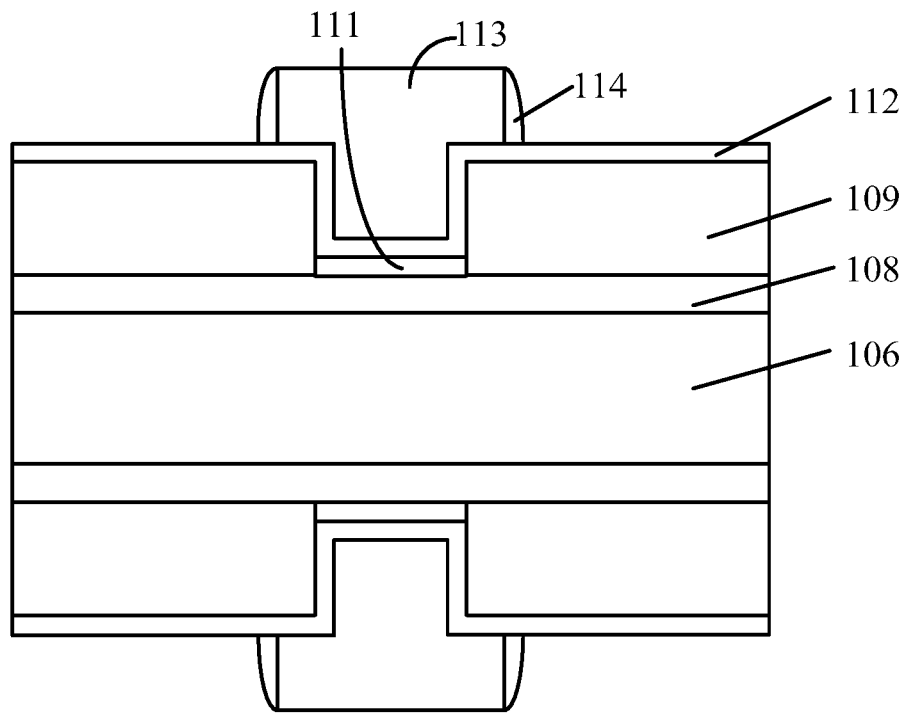

Returning to FIG. 20, after forming the gate electrode layer 113, sidewall spacers may be formed (113). FIG. 18 illustrates a corresponding semiconductor structure.

As shown 18, sidewall spacers 114 are formed on the side surfaces of the gate electrode layer 113. The sidewall spacers 114 may be used to protect the gate electrode layer 113 from being damaged. Further, the sidewall spacers 114 may also be used as a mask for subsequently etching the gate dielectric film 112.

A process for forming the sidewall spacers 114 may include forming a sidewall spacer film covering the gate electrode layer 113 and the gate dielectric film 112; and followed by etching the sidewall spacer film to expose the surface of the gate electrode layer 113 and the surface of the gate dielectric film 112. The portion of the sidewall spacer film on the side surfaces of the gate electrode layer 113 may be kept; and may be used as the sidewall spacers 114.

The sidewall spacers 114 may be made of one or more of silicon oxide, silicon nitride and silicon oxynitride, etc. The sidewall spacer film may be formed by any appropriate process, such as a CVD process, a PVD process, or an FCVD process, etc. The sidewall spacer film may be etched by any appropriate process, such as a dry etching process, a wet etching process, or an ion beam etching process, etc.

Returning to FIG. 20, after forming the sidewall spacers 114, source and drain regions may be formed (S114). FIG. 19 illustrates a corresponding semiconductor structure.

As shown in FIG. 19, source and drain regions 115 are formed in the contact layer 119 at both sides of the gate electrode layer 113. Further, a gate dielectric layer 112a is formed. The gate dielectric layer 112a, the gate electrode layer 113 and the sidewall spacers 114 may together form a gate structure of the transistor. The gate structure may cover the potential barrier layer 111, and may also cover portions of the contact layer 109.

The source and drain regions 115 and the gate dielectric layer 112a may be formed by etching the gate dielectric material film 112 and a top portion of the contact layer 109 using the sidewall spacers 114 and the gate electrode layer 113 as an etching mask to form source and drain openings; and followed by filling the source and drain openings with a material to form the source and drain regions 115. The portion of the gate dielectric material film 112 under the gate electrode layer 113 and the sidewall spacers 114 may form the gate dielectric layer 112a.

The gate dielectric material film 112 and the contact layer 109 may be etched by any appropriate process, such as a dry etching process, a wet etching process, or an ion beam etching process, etc. The source and drain regions 115 may be made of any appropriate material, such as NiAu, TiAu, NiPt, or TiN, etc. In one embodiment, the source and drain regions 115 are made of NiAu. NiAu may decrease the contact resistance between the source and drain regions 115 and the subsequently formed contact vias.

Thus, a transistor may be formed by the above disclosed processes and methods; and the corresponding transistor is illustrated in FIG. 8 and FIG. 19. As shown in FIG. 8 and FIG. 19, the transistor includes a semiconductor substrate 100; and at least one nanowire 106 suspended in the semiconductor substrate 100. The transistor also includes an insulation layer 107 formed on the surface of the semiconductor substrate 100 under the nanowire 106; and a channel layer 108 surrounding the surface of the nanowire 106. Further, the transistor also includes a contact layer 109 surrounding the surface of the channel layer 108; and a potential barrier layer 111 surrounding a portion of the surface of the channel layer 108 and formed in the contact layer 109. Further, the transistor also includes a gate structure (not labeled) surrounding the surface of the potential barrier layer 111 and a portion of the contact layer 109; and source and drain regions 115 formed in the surface of the contact layer 109 at both sides of the gate structure. The gate structure may include a gate dielectric layer 112*a* surrounding the potential barrier layer 111 and a portion of the surface of the contact layer; a gate electrode layer 113 formed on the gate dielectric layer 112*a* and sidewall spacers 114 formed on the side surfaces of the gate electrode layer 113. The detailed structures and intermediate structures are described above with respect to the fabrication processes.

The potential barrier layer 111 and the nanowire 106 may form a heterojunction structure; and two-dimensional electron gas (2-DEG) may exist in the heterojunction. Thus, such a transistor may be referred as quantum-well based transistor. Because the 2-DEG may not be affected by the scattering of the ionized doping ions, the carrier mobility in the transistor may be significantly high. Therefore, the transistor may also be referred as a high electron mobility transistor (HEMT).

According to the disclosed methods and structures, the gate structure, the source and drain regions of the transistor are formed using a nanowire as a base structure. The channel region of the transistor may be controlled from all radial directions. Thus, the control ability of the gate structure of such a transistor to the channel region may be significantly strong.

Further, during the fabrication of the nanowire, a plurality of first openings may be formed in the semiconductor substrate first. Then, a semiconductor layer may be formed in the plurality of first openings. Then, the semiconductor substrate may be etched to form second openings to expose the sides of the semiconductor layer. Then, the semiconductor layer may be treated by oxidation processes, etching processes, and thermal annealing processes; and the nanowires may be formed. The nanowires formed by such processes may have desired quality; and the fabrication process of the nanowires may be relatively simple.

Further, the second openings may be formed by a selective etching process. Thus, the fabrication process of the nanowires may be effectively simplified.

The above detailed descriptions only illustrate certain exemplary embodiments of the present invention, and are not intended to limit the scope of the present invention.

Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a transistor, comprising:
   providing a semiconductor substrate;
   forming at least a nanowire suspending in the semiconductor substrate;
   forming a channel layer surrounding the nanowire;
   forming a contact layer surrounding the channel layer;
   forming a trench exposing the channel layer and surrounding the channel layer in the contact layer;
   forming a potential barrier layer on a bottom of the trench and surrounding the channel layer;
   forming a gate structure surrounding the potential barrier layer and covering portions of the contact layer; and
   forming a source region and a drain region in the contact layer at two sides of the gate structure, respectively.

2. The method according to claim 1, wherein forming the nanowire suspending in the semiconductor substrate further comprises:
   forming a plurality of first openings in the semiconductor substrate;
   forming a semiconductor layer in the plurality of first openings;
   etching the semiconductor substrate to form second openings to expose sides of the semiconductor layer;
   forming an oxide layer covering remaining semiconductor layer and the semiconductor substrate;
   removing the oxide layer to cause the remaining semiconductor layer to suspend in the semiconductor substrate; and
   performing a thermal annealing process to the remaining semiconductor layer to form at least a nanowire and a third opening.

3. The method according to claim 2, wherein:
   the first openings have one of a bowl shape and regular polygon shape; and
   the portions of the semiconductor layer in the first openings have one of a bowl shape and regular polygon shape.

4. The method according to claim 2, wherein:
   the second openings are formed by a selective etching process.

5. The method according to claim 2, wherein:
   the oxide layer is formed by one of a thermal oxidation process and a wet oxidation process.

6. The method according to claim 5, wherein:
   a temperature of the thermal oxidation process is in a range of approximately 800° C.~1200° C.;
   an oxygen flow rate of the thermal oxidation process is in a range of approximately 0.5 l/min~5.0 l/min; and
   a time duration of the thermal oxidation process is in a range of approximately 30 min~300 min.

7. The method according to claim 5, wherein:
   a thickness of the oxide layer is in a range of approximately 2.0 nm~20.0 nm.

8. The method according to claim 2, wherein:
   the oxide layer is removed by a wet etching process.

9. The method according to claim 8, wherein:
   an etching solution of the wet etching process is a hydrogen fluoride solution; and a volume ratio of hydrogen fluoride and water in the hydrogen fluoride solution is in a range of approximately 1:10~1:5.

10. The method according to claim 2, wherein:
a protection gas of the thermal annealing process is one of $H_2$ and He;
a temperature of the thermal annealing process is in a range of approximately 650° C.~1100° C.; and
a pressure of the protection gas of the thermal annealing process is in a range of approximately 0.665 Pa~1.01e15 Pa.

11. The method according to claim 2, wherein:
the thermal annealing process is one of a single-step thermal annealing process and a multiple-step thermal annealing process.

12. The method according to claim 1, wherein:
the channel layer and the contact layer are formed by one of a molecular beam epitaxial growth process, an atomic layer deposition process and a metal organic chemical vapor deposition process.

13. The method according to claim 1, after forming the nanowire, further comprising:
forming an insulation layer on the semiconductor substrate under the nanowire.

* * * * *